(12) United States Patent
Mineur et al.

(10) Patent No.: US 8,702,512 B2
(45) Date of Patent: Apr. 22, 2014

(54) MULTI PLAYER MATERIAL FIGURE/ELECTRONIC GAMES BOARD INTERACTIVE ASSEMBLY WITH AUTOMATIC FIGURE AUTHENTIFICATION

(76) Inventors: Jean Etienne Mineur, Limoges (FR); Bertrand Duplat, Limoges (FR)

( * ) Notice: Subject to any disclaimer, the term of this patent is extended or adjusted under 35 U.S.C. 154(b) by 0 days.

(21) Appl. No.: 13/261,388

(22) PCT Filed: Jan. 12, 2011

(86) PCT No.: PCT/FR2011/000013
§ 371 (c)(1), (2), (4) Date: Jul. 26, 2012

(87) PCT Pub. No.: WO2011/151531
PCT Pub. Date: Dec. 8, 2011

(65) Prior Publication Data
US 2013/0072303 A1      Mar. 21, 2013

(30) Foreign Application Priority Data

Jun. 2, 2010  (FR) ..................... 10 02334
Jul. 30, 2010 (FR) ..................... 10 03200

(51) Int. Cl.
*A63F 9/24*    (2006.01)
*A63F 13/00*   (2014.01)

(52) U.S. Cl.
USPC ................ 463/37; 463/36; 463/39; 345/173; 345/179

(58) Field of Classification Search
USPC .................. 463/36, 37; 273/237; 345/179
See application file for complete search history.

(56) References Cited

U.S. PATENT DOCUMENTS

| | | | | |
|---|---|---|---|---|
| 5,098,106 A | * | 3/1992 | Hegener | 273/238 |
| 5,483,261 A | * | 1/1996 | Yasutake | 345/173 |
| 5,488,204 A | * | 1/1996 | Mead et al. | 178/18.06 |
| 5,717,423 A | * | 2/1998 | Parker | 345/108 |
| 5,853,327 A | * | 12/1998 | Gilboa | 463/39 |
| 6,102,397 A | * | 8/2000 | Lee et al. | 273/238 |
| 6,202,929 B1 | * | 3/2001 | Verschuur et al. | 235/462.25 |
| 6,367,015 B1 | * | 4/2002 | Kubo et al. | 713/183 |
| 6,443,796 B1 | * | 9/2002 | Shackelford | 446/91 |
| 6,690,156 B1 | * | 2/2004 | Weiner et al. | 324/207.17 |
| 6,937,152 B2 | * | 8/2005 | Small | 340/568.1 |
| 7,007,168 B2 | * | 2/2006 | Kubo et al. | 713/183 |
| 7,008,316 B1 | * | 3/2006 | Pugh | 463/10 |
| 7,016,532 B2 | * | 3/2006 | Boncyk et al. | 382/165 |
| 7,017,905 B2 | * | 3/2006 | Lindsey | 273/146 |
| 7,030,861 B1 | * | 4/2006 | Westerman et al. | 345/173 |
| 7,077,332 B2 | * | 7/2006 | Verschuur et al. | 235/492 |
| 7,092,747 B2 | * | 8/2006 | Park et al. | 455/575.4 |
| 7,208,960 B1 | * | 4/2007 | Deangelis et al. | 324/661 |
| 7,467,380 B2 | * | 12/2008 | Kurlander et al. | 717/174 |
| 7,469,381 B2 | * | 12/2008 | Ording | 715/702 |
| 7,590,858 B2 | * | 9/2009 | Kubo et al. | 713/183 |
| 7,753,276 B2 | * | 7/2010 | Gelbman | 235/451 |
| 7,780,513 B2 | * | 8/2010 | Lin | 463/14 |
| 7,902,840 B2 | * | 3/2011 | Zachut et al. | 324/663 |
| 8,215,642 B2 | * | 7/2012 | Macura et al. | 273/309 |
| 8,243,050 B2 | * | 8/2012 | Adkiins | 345/179 |

(Continued)

*Primary Examiner* — Steven J Hylinski
(74) *Attorney, Agent, or Firm* — Ladas & Parry LLP

(57) ABSTRACT

The present invention relates to an authentication signature recognized by a capacitive screen, characterized in that it is achieved by a zone of dots that are meshed with one another printed in conductive ink, the signature zone being pressed against the capacitive screen by conductive means by the user on the capacitive screen.

7 Claims, 3 Drawing Sheets

(56) References Cited

U.S. PATENT DOCUMENTS

| | | | |
|---|---|---|---|
| 8,248,388 B2* | 8/2012 | Park et al. | 345/176 |
| 8,297,513 B2* | 10/2012 | Wallace et al. | 235/487 |
| 8,336,119 B2* | 12/2012 | Phelps et al. | 2/167 |
| 8,368,653 B2* | 2/2013 | Han et al. | 345/173 |
| 8,405,628 B2* | 3/2013 | Luu | 345/173 |
| 8,517,383 B2* | 8/2013 | Wallace et al. | 273/237 |
| 2004/0018878 A1* | 1/2004 | Silverman | 463/46 |
| 2006/0175753 A1* | 8/2006 | MacIver et al. | 273/237 |
| 2007/0013681 A1* | 1/2007 | Chou | 345/179 |
| 2007/0062852 A1* | 3/2007 | Zachut et al. | 209/683 |
| 2007/0104348 A1* | 5/2007 | Cohen | 382/100 |
| 2007/0252821 A1* | 11/2007 | Hollemans et al. | 345/173 |
| 2008/0168404 A1* | 7/2008 | Ording | 715/863 |
| 2008/0180405 A1* | 7/2008 | Han et al. | 345/173 |
| 2008/0211785 A1* | 9/2008 | Hotelling et al. | 345/173 |
| 2009/0073134 A1* | 3/2009 | Huang et al. | 345/173 |
| 2009/0315258 A1* | 12/2009 | Wallace et al. | 273/238 |
| 2010/0090988 A1* | 4/2010 | Park | 345/179 |
| 2011/0148791 A1* | 6/2011 | Luu | 345/173 |
| 2012/0007817 A1* | 1/2012 | Heatherly et al. | 345/173 |
| 2012/0262386 A1* | 10/2012 | Kwon et al. | 345/173 |

* cited by examiner

MULTI PLAYER MATERIAL FIGURE/ELECTRONIC GAMES BOARD INTERACTIVE ASSEMBLY WITH AUTOMATIC FIGURE AUTHENTIFICATION

TECHNICAL FIELD

The present invention relates to a signature imprint made up of a mesh of pinholes which is recognizable on a capacitive screen. The invention is particularly suited to a multi-player figure/electronic games board interactive assembly. The invention is likewise applicable to "solo" applications which allow the user's identity to be automatically recognized.

The invention is likewise suited to a signature on a sheet of paper, on playing cards or on product packaging.

The invention is likewise suitable for recognition by computer touchpads, which are surfaces which recognize finger movements and transcribe orders to the computer which are visible on screen.

BACKGROUND ART

Various pairings of figure/board interactive devices are known. Traditionally, material figures/material board pairings are known for board games. Electronic games boards are also known, but these are controlled by electronic joysticks.

A multi-player games board which is controlled by material figures moving on the electronic games board is not known in the art.

DISCLOSURE OF THE INVENTION

The object of the invention is actually to provide a traditionally material games board made of cardboard or a printed sheet with new functions using known touchscreen technology. The invention is therefore particularly suited to new mobile phones with touchscreens or interactive tablets.

A main object of the invention is to propose a multi-player game assembly using material figures which move around an electronic digital board with touchscreen technology. The invention is likewise suitable for a one-person work station; activation by the identified figure of a user activates the specific working interface of said person on the board.

An object of the invention is to use the digital screen to vary the representations of the game, depending on the specific activation of each player identified by their figure.

An object of the invention is to combine the material recognition of each player's figure with a specific software function which specifically activates the game depending on the figure and the instruction given by said figure.

An object of the invention is likewise to propose a totally digital shaded version, which fades in the possible absence of the figure.

An object of the invention is to propose an automatic recognition device for each figure on the touchscreen.

An object of a variant of the invention is to propose material figures which are robots. These robot figures can be navigated by receiving luminous instructions from the touchscreen.

An object of the invention is to propose an assembly that is economical, easily lends itself to large-scale manufacture and is adapted to the latest touchscreen terminal technology.

An object of the invention is to be able to easily adapt traditional material board games. The invention simply seeks to develop a first figure/board recognition and interactivity software package, then for each games board, computer graphics and its game rules management software.

An object of the invention is to propose automated figure recognition on a touchscreen.

An object of the invention is to use the figure to alter the digital representation of the board playing surface. When it is moved on the touchscreen, the figure assumes the function of a joystick and transmits a move and/or rotation onto the screen surface.

An object of the invention is to propose a personalized signature that can easily be printed on the front or back of a sheet of paper or on the front or back of packaging. In performing this function, the signature can replace tools such as the barcode/barcode reader pairing by replacing it with the pin signature/touchscreen coupling.

In one aspect, the touchscreen is a screen using what is known as capacitive technology.

In a main aspect, the invention proposes conductive figures which have a signature pad. This signature pad allows the software of the electronic game platform to recognize automatically by moving the playing piece onto the game of the playing piece concerned.

In one aspect, the invention proposes a robotic figure which is able to read luminous instructions and a games board which channels luminous instructions below the figure's pad. These playing instructions automatically generate physical movements of the figure on the screen. The physical movements of the figure may likewise generate graphics scrolling on the on-screen playing surface.

In one aspect, the invention intends to propose pads which are formed by the printing of conductive ink on a sheet of paper.

In one aspect, the invention intends to propose pads which are formed by printing static electricity conductor material, mousse or plastic or special material, on a sheet of paper.

BRIEF DESCRIPTION OF THE DRAWINGS

The attached figures represent a particular embodiment of the invention in which.

PREFERRED MODES FOR CARRYING OUT THE INVENTION

Figure 1:
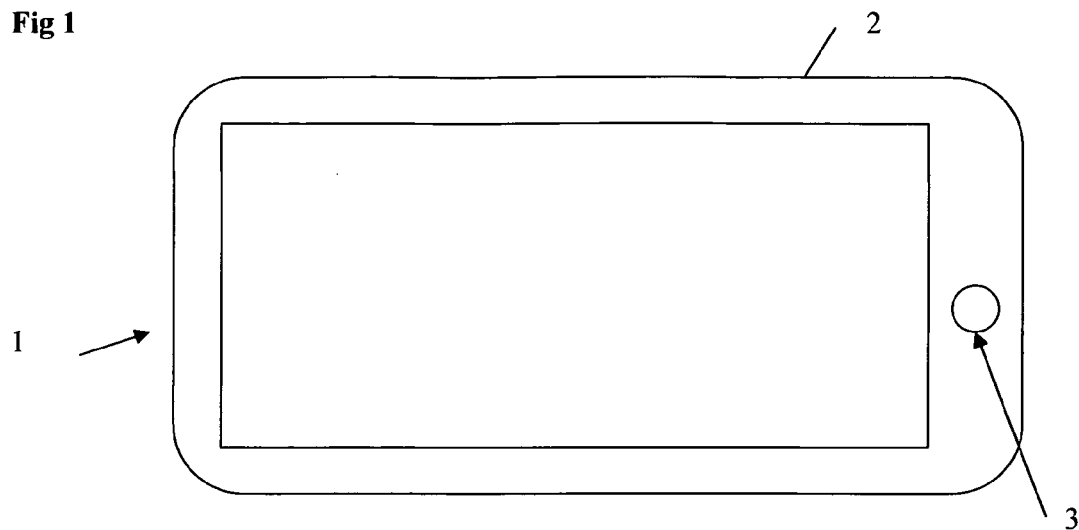
FIG. 1 represents an electronic games board according to the invention
Figure 2:
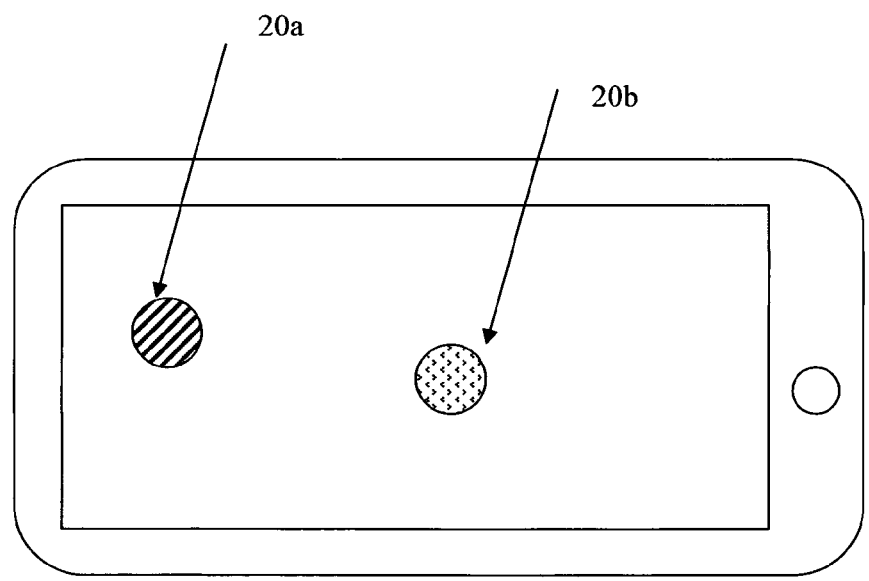
FIG. 2 represents a games board with figures according to the invention
Figure 3A:
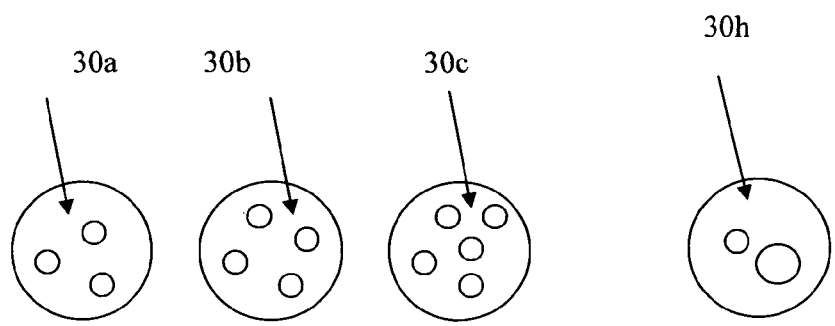
FIGS. 3*a* and 3*b* represent a plurality of figure pads
Figure 3B:
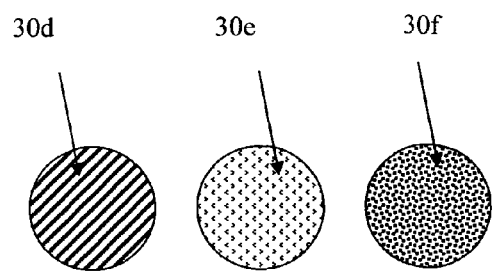
Figure 4:
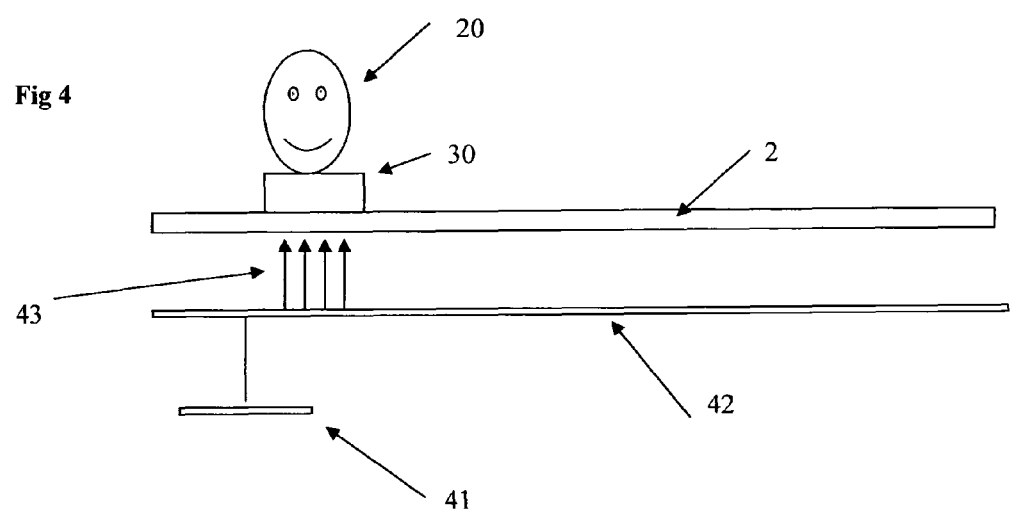
FIG. 4 represents a car figure controlled by the screen according to a variant of the invention
Figure 5A:
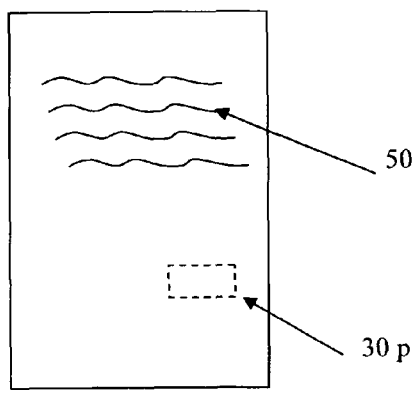
FIGS. 5*a* and 5*b* represent a variant of the invention with a signature zone on both sides of a sheet
Figure 5B:
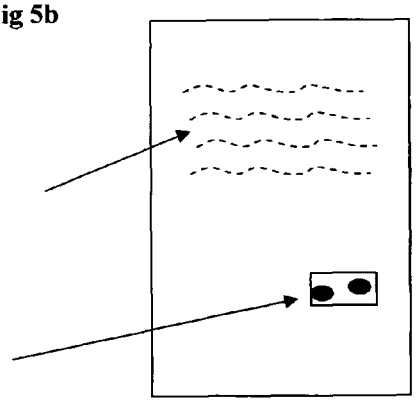
Figure 6:
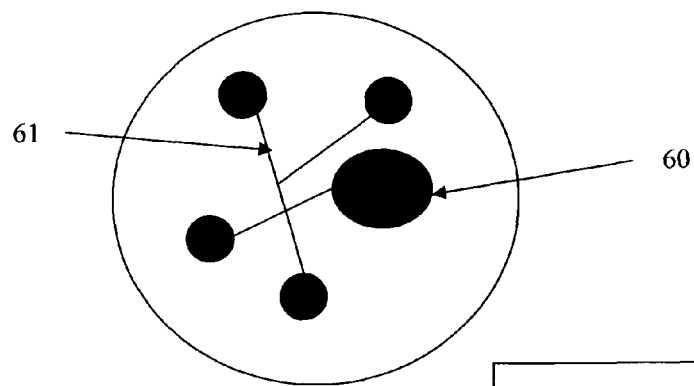
FIG. 6 represents a variant of a signature zone on one with a connected mesh of conductive ink dots
Figure 7:
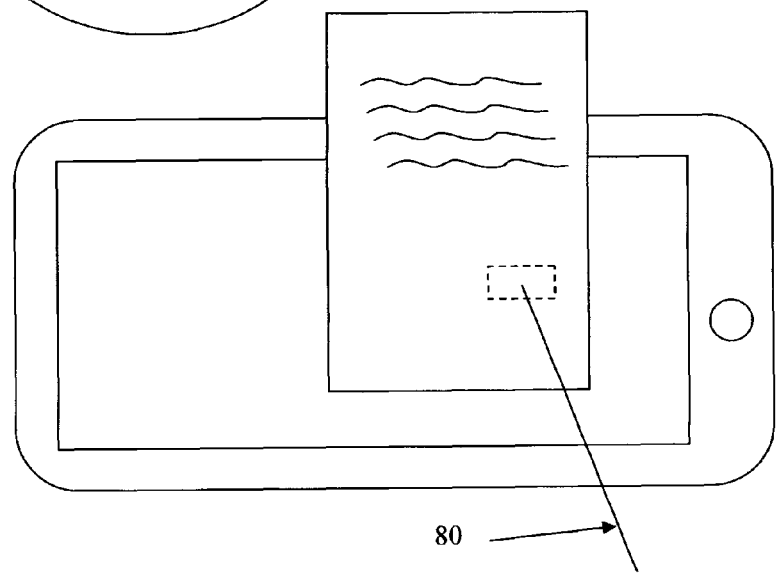
FIG. 7 represents the reading of a sheet from FIG. 6 on a capacitive screen
Figure 8:
FIG. 8 represents means of bringing the sheet into contact on the capacitive screen

FIG. 1 represents an electronic games board (1) comprising a touchscreen (2) and a manual joystick (3) of the games board. This games board is, for example, a latest generation mobile phone or a latest generation electronic tablet or a computer with a touchpad. FIG. 2 represents a games board (1) with two figures (20*a*, 20*b*) which are the figures which represent the playing piece of each of two players who are in the process of playing a game. FIGS. 3*a* and 3*b* represent a plurality of figure pads (30*a*, 30*b*, 30*c*, 30*h*, 30*d*, 30*e*, 30*f*). These pads comprise pins (30*a*, 30*b*, 30*c*, 30*h*), streaks (30*d*), grain qualities (30e, 30f). In a certain form, to increase the identification capacity, the pinholes are of different sizes, figure 30h. By placing the figure on the screen or by moving the figure on the screen, said figure is recognized by the games board software. In effect, the touchscreen includes a grid which analyses the grid of each pad. The software assigns a player identity to each pad identified by the screen reading grid. It is understood, for example, that the pad may include three, four, five, six or more pins. It is likewise understood that the pad grid may exhibit a particular grid pattern (slots, grains) which is identified by the screen reading grid. It is likewise understood that the grid may be planar and simply materialized by conductive ink printing. FIG. 4 represents a variant of the invention with a car figure (20) which is a small robot resting on its pad (30). In this variant, the base is not only recognized by the screen grid, but it is also navigated by the control chip (41) of the controlling board, issued by the board's light-emitting layer (42), the emission of light rays (43) according to specific encoded characteristics. These encoded rays give instructions to the robotic figure which is moved on the screen. FIGS. 5a and 5b represent a variant of the invention with a signature zone on both sides of a sheet. The text and reading patterns (50) are printed on the front of the sheet and the signature zone (30p), as described in FIG. 6, is printed in conductive ink on the back of the sheet. To read the signature, see FIG. 7, the user presses the signature zone (30p) against the capacitive screen, taking care to use the means in FIG. 8, which are either the user's finger (80a) or a conductive stylus (80b) or a conductive figure. The aim is that the capacitive screen is able to read the signature zone and is therefore supplied with static electricity coming from the user body. FIG. 6 represents a variant of the signature zone on one with a connected mesh of conductive ink dots. This Figure repeats the principle of FIGS. 3a and 3b with a mesh of pins with the improvement that this time the pins are conductive ink dots (60). The signature dots (60) are meshed (61) and connected to one another by fine connections in conductive ink, such that when the user presses on the signature zone without forcibly pressing on all the dots, all the dots are nevertheless fed with static electricity. The invention highlights a discovery that was not absolutely evident a priori, which is that the sheet paper transmits the conductivity. If the back of the sheet is covered with a signature zone, by pressing on the front with conductive means, the user can activate the reading of the signature by the capacitive screen. The signals are effectively conducted through the paper thickness. It is of course clear that the pad of the conductive figure may likewise be covered with a signature zone created by adhering a signed sheet of paper with a signature zone according to FIG. 6. The transmission shall be effected by the user taking the figure in his hand, said user placing it on the capacitive screen. It is likewise clear that the conductive mesh of dots can be produced in the body of the figure and that only the end of the mesh with a number of dots/pins appears on the planar pad of the figure.

It is therefore understood that the invention makes it possible to recognize figures which are positioned above. It likewise makes it possible for the material movement of the figures on the screen to be followed by the game software, which adapts according to the graphic interface represented on screen. It finally makes it possible with an advanced function to navigate the figure by placing it on the screen. In this advanced version, the invention allows a dialogue to take place between a digital screen and a robotic figure, the graphics interface represented on the touchscreen being a function of this dialogue between the touchscreen and the robotic figure The present invention therefore relates to an authentication signature recognized by a capacitive screen, characterized in that it is achieved by a zone of dots (60) that are meshed (61) with one another printed in conductive ink, the signature zone being pressed against the capacitive screen by conductive means (80) by the user on the capacitive screen.

The present invention relates to a multi-player material figure (20)/electronic games board interactive assembly run by game software which represents the games board plan on a screen, characterized in that the figures move on touchscreen (2) and include a pad with an authentication which can be identified by moving them on the reading grid of the board's touchscreen.

The present invention relates to a multi-player material figure (20)/electronic games board interactive assembly, characterized in that the authentication grid is a pin grid.

The present invention relates to a multi-player material figure (20)/electronic games board interactive assembly, characterized in that the number of pins on the figure pad allows the figure to be authenticated.

The present invention relates to a multi-player material figure (20)/electronic games board interactive assembly, characterized in that the figure (20) is a car robot that rests on its pad (30) which is recognized by the grid of the screen but is likewise navigated by the control chip (41) of the controlling board, issued by the board's light-emitting layer (42), the emission of light rays (43) according to specific encoded characteristics.

It is clear that a plurality of variants possibly capable of being combined can be provided here without going beyond the framework of the invention as defined below.

What we claim as our invention:
1. A material figure (20) including:
   a pad with an authentication signature, the authentication signature being achieved by a signature zone comprising a conductive mesh (61) of dots (60), and
   conductive means supplying the conductive mesh (61) of conductive dots (60) with static electricity of a user holding the material figure;
   whereby the material figure can be identified by a reading grid of a capacitive screen of an electronic game board, when the pad of the material figure is pressed against the capacitive screen by the user holding the material figure.
2. A multi-player material figure (20) and electronic games board interactive assembly run by game software which represents the games board plan on a screen, wherein the figures are conductive figures and the screen is a capacitive touchscreen having a reading grid, the figures being moveable on the capacitive touchscreen (2), each figure including:
   a pad with an authentication grid comprising a conductive mesh (61) of conductive dots (60); and
   conductive means arranged to feed the conductive mesh (61) of conductive dots (60) with static electricity of a user holding the material figure;
   wherein each figure can be identified by the reading grid of the board's touchscreen when the pad of the material figure is placed on the capacitive screen by the user holding the material figure.
3. A multi-player material figure (20) electronic games board interactive assembly run by game software which represents the games board plan on a screen, wherein the figures are conductive figures and the screen is a capacitive touchscreen having a reading grid, the figures being moveable on the capacitive touchscreen (2), each figure including:
   a pad with an authentication grid comprising a conductive mesh (61) of conductive pins (60); and conductive means arranged to feed the conductive mesh (61) of conductive pins (60) with static electricity of a user holding the material figure;

wherein each figure can be identified by the reading grid of the board's touchscreen when the pad of the material figure is placed on the capacitive screen by the user holding the material figure.

4. The multi-player material figure (20) and electronic games board interactive assembly according to claim 2, wherein figure (20) is a robot that rests on its pad (30) which recognized by the grid of the screen but is likewise navigated by a control chip (41) of the board, the control chip controlling the emission of light rays (43) issued by the board's light-emitting layer (42), according to specific encoded characteristics.

5. The multi-player material figure (20) and electronic games board interactive assembly according to claim 3, characterized in that the figure (20) is a robot that rests on its pad (30) which is recognized by the grid of the screen but is likewise navigated by a control chip (41) of the board, the control chip controlling the emission of light rays (43) issued by the board's light-emitting layer (42), according to specific encoded characteristics.

6. The multi-player material figure (20) and electronic games board interactive assembly according to claim 4, characterized in that the figure (20) is able to read luminous instructions channeled by the games board below the figure's pad.

7. The multi-player material figure (20) and electronic games board interactive assembly according to claim 5, characterized in that the figure (20) is able to read luminous instructions channeled by the games board below the figure's pad.

* * * * *